US010147863B2

(12) United States Patent
Xu et al.

(10) Patent No.: US 10,147,863 B2
(45) Date of Patent: Dec. 4, 2018

(54) PYROELECTRIC SANDWICH THERMAL ENERGY HARVESTERS

(71) Applicant: The United States of America as represented by the Administrator of the National Aeronautics and Space Administration, Washington, DC (US)

(72) Inventors: Tian-Bing Xu, Hampton, VA (US); Jin Ho Kang, Newport News, VA (US); Emilie J. Siochi, Newport News, VA (US); Glen C. King, Williamsburg, VA (US)

(73) Assignee: The United States of America as represented by the Administrator of NASA, Washington, DC (US)

( * ) Notice: Subject to any disclaimer, the term of this patent is extended or adjusted under 35 U.S.C. 154(b) by 523 days.

(21) Appl. No.: 14/879,506

(22) Filed: Oct. 9, 2015

(65) Prior Publication Data

US 2016/0104831 A1    Apr. 14, 2016

Related U.S. Application Data

(60) Provisional application No. 62/061,878, filed on Oct. 9, 2014.

(51) Int. Cl.
*H01L 41/02* (2006.01)
*H01L 37/02* (2006.01)

(52) U.S. Cl.
CPC .................................... *H01L 37/02* (2013.01)

(58) Field of Classification Search
USPC .................................................. 310/338, 339
See application file for complete search history.

(56) References Cited

U.S. PATENT DOCUMENTS

| 4,706,069 | A | * | 11/1987 | Tom ..................... G08B 13/191 310/319 |
| 4,845,688 | A |   | 7/1989  | Butler |
| 4,954,811 | A | * | 9/1990  | Chatigny .................. G01L 1/16 310/332 |
| 4,999,818 | A |   | 3/1991  | Malleolo |
| 5,254,504 | A | * | 10/1993 | Van der Spiegel ... B06B 1/0688 427/100 |
| 5,276,657 | A |   | 1/1994  | Newnham et al. |
| 5,729,077 | A |   | 3/1998  | Newnham et al. |

(Continued)

FOREIGN PATENT DOCUMENTS

JP          08107239 A      4/1996

*Primary Examiner* — Thomas Dougherty
(74) *Attorney, Agent, or Firm* — Jennifer L. Riley; Robin W. Edwards; Mark P. Dvorscak

(57) ABSTRACT

Systems, methods, and devices of the various embodiments provide pyroelectric sandwich thermal energy harvesters. In the various embodiment pyroelectric sandwich thermal energy harvesters, generated electrical energy may be stored in a super-capacitor/battery as soon as it is generated. The various embodiment pyroelectric sandwich thermal energy harvesters may harvest electrical energy from any environment where temperature variations occur. The various embodiment pyroelectric sandwich thermal energy harvesters may be power sources for space equipment and vehicles in space and/or on earth, as well as the for wireless sensor networks, such as health monitoring systems of oil pipes, aircraft, bridges, and buildings.

13 Claims, 5 Drawing Sheets

(56) References Cited

U.S. PATENT DOCUMENTS

| | | |
|---|---|---|
| 6,232,702 B1 | 5/2001 | Newnham et al. |
| 6,407,484 B1 | 6/2002 | Oliver et al. |
| 6,465,936 B1 | 10/2002 | Knowles et al. |
| 6,614,143 B2 | 9/2003 | Zhang et al. |
| 6,623,111 B2 | 9/2003 | Nakatani |
| 6,629,922 B1 | 10/2003 | Puria et al. |
| 6,717,333 B2 | 4/2004 | Hermle et al. |
| 6,895,825 B1 | 5/2005 | Barkhoudarian |
| 6,927,528 B2 | 8/2005 | Barillot et al. |
| 6,994,110 B2 | 2/2006 | Barillot et al. |
| 7,034,411 B2 * | 4/2006 | Chen .................. H01L 37/02 136/205 |
| 7,227,295 B2 | 6/2007 | Or et al. |
| 7,355,325 B2 | 4/2008 | Johansson et al. |
| 7,394,181 B2 | 7/2008 | Su et al. |
| 7,446,459 B2 | 11/2008 | Xu et al. |
| 7,453,187 B2 | 11/2008 | Richards et al. |
| 7,498,681 B1 | 3/2009 | Kellogg et al. |
| 7,663,294 B2 | 2/2010 | Ruggeri et al. |
| 7,692,366 B2 | 4/2010 | Thiesen |
| 7,768,177 B2 | 8/2010 | Yang et al. |
| 7,878,453 B2 * | 2/2011 | Liggett .................. B64B 1/14 244/126 |
| 9,627,997 B2 * | 4/2017 | Kim ...................... F01N 5/025 |
| 9,761,784 B2 * | 9/2017 | Miyoshi .................. H04R 7/04 |
| 2005/0057123 A1 | 3/2005 | Deng |
| 2006/0119224 A1 * | 6/2006 | Keolian .................. H02N 2/18 310/339 |
| 2008/0238260 A1 | 10/2008 | Xu et al. |
| 2009/0115292 A1 | 5/2009 | Ueda et al. |
| 2009/0127982 A1 | 5/2009 | Praino et al. |
| 2010/0019620 A1 | 1/2010 | Kastl et al. |
| 2010/0042389 A1 * | 2/2010 | Farruggia ................ B08B 3/12 703/6 |
| 2010/0044459 A1 | 2/2010 | Xu et al. |
| 2010/0096949 A1 | 4/2010 | Xu et al. |
| 2018/0160248 A1 * | 6/2018 | Murakami .......... H04R 17/005 |

* cited by examiner

PYROELECTRIC SANDWICH THERMAL ENERGY HARVESTERS

CROSS-REFERENCE TO RELATED PATENT APPLICATIONS

This patent application claims the benefit of priority to U.S. provisional patent application No. 62/061,878 entitled "Pyroelectric Sandwich Thermal Energy Harvesters" filed Oct. 9, 2014, the entire contents of which are hereby incorporated by reference in their entirety.

STATEMENT REGARDING FEDERALLY SPONSORED RESEARCH OR DEVELOPMENT

The invention described herein was made in part by employees of the United States Government and may be manufactured and used by and for the Government of the United States for governmental purposes without the payment of any royalties thereon or therefore.

BACKGROUND OF THE INVENTION

1. Field of the Invention

The present invention relates pyroelectric power generation systems, and more particularly to pyroelectric systems to harvest thermal energy from waste heat.

2. Description of the Related Art

Solar, thermal, and mechanical energy (including vibration, motion, and wind) are three major renewable energy sources in the environment that are not fully utilized. For example, some studies estimate that fifty percent of the energy generated annually from all sources is lost as waste heat. Specifically, the current energy efficiency of automobile engines is only about 33% for mechanical drives. The remaining 66% of energy is wasted as thermal recuperation including engine heat up, engine coolant/oil heat exchange, and exhaust gas, in which only 34% of total energy is used for driving a vehicle. Efforts to increase engine efficiencies include new combustion engine designs and fuel modification, but high waste of heat energy remains an issue, and a potential source of renewable energy.

Silicon based solar cells that dominate this field typically harvest 15-20% of available solar energy, with the balance going to waste thermal energy. While several efforts to increase efficiency utilizing heterojunction photovotalics, like silicon germanium or dye-sensitized solar cells have been published, the efficiency or stability is still very low, although some higher efficiencies are beginning to be realized for solar cells in laboratory tests. Similarly, a majority of piezoelectric and electromagnetic vibration/motion harvesting technologies harvest less than 10% of mechanical energy inputs under ideal laboratory conditions.

Thermal energy harvesting research is largely focused on thermoelectrics, for which the large P-N junction temperature gradient required for effective use of thermoelectrics necessitates complex device designs and yields very low efficiencies. Examples of some approaches that have been developed recently include attempts to utilize waste heat from exhaust gas generated by engines using thermoelectric devices. The thermoelectric elements (p-type and n-type) are connected to harvest thermal energy from exhaust gas flow to generate electrical energy. Fuel economy of these system increased by only 3-5%, due to the low efficiency (5%) of the thermoelectric element. Additionally, in many thermoelectric systems, a cooling system is embedded to create a temperature difference ($\Delta T$) between hot side (exhaust gas flow) and cold side (coolant flow). This results in a complicated system and weight penalty. In addition, to generate significant amount of electricity, engines have to be running, and get hot enough to reach the specific temperature difference required for a thermoelectric device to function.

Pyroelectricity is the ability of certain materials to generate surface charge and build a temporary voltage when they are heated or cooled. As opposed to thermoelectric materials which require a temperature gradient between two portions of the thermoelectric material to generate a charge, pyroelectric materials generate a charge and build a temporary voltage when the pyroelectric material itself increases or decreases in temperature. Thus, no need to maintain a temperature gradient between portions of a pyroelectric material is required to generate a charge and build a temporary voltage. A pyroelectric material can be repeatedly heated and cooled (analogous to a heat engine) to generate usable electrical power. It is calculated that a pyroelectric material in an Ericsson cycle could reach from 50% to 84-92% of Carnot efficiency. These efficiency values are for the pyroelectric material itself, and ignores losses from heating and cooling the substrate, other heat-transfer losses, and all other losses elsewhere in the system.

In the last half century, several pyroelectric energy harvesters have been invented to convert waste thermal energy into electrical energy. Compared with thermoelectric energy harvesters, where large P-N junction temperature gradients required for effective use of thermoelectrics necessitate complex device designs and yield very low efficiencies, a pyroelectric energy harvester can be designed more simply and with higher efficiency. Pyroelectrics have advantages over thermoelectrics since thermal gradients on the order of those required for thermoelectrics are not needed for voltage generation. However, previous pyroelectric energy harvesters have not been commercialized.

Massive thermal cycle energies exist on the surface of the earth. For instance, 1) an average of 10° C. difference exists between daytime and nighttime on Earth's surface, 2) more than 50° C. difference is realized when an isolated object is exposed to direct sunlight, and 3) more than 100° C. thermal variation is generated by engine exhaust manifolds during a standard drive cycle. Further, large amounts of waste heat are generated from refrigeration and heat pumps. This can account for over 50% of terrestrial energy consumption.

Massive thermal cycle energies exist in space environments, as well, and, compared to on the earth, a larger magnitude of thermal cycles is available in space environments (e.g., temperature ranges from −59° C. to 93° C. ($\Delta T=152K$) per daily cycle at low Earth orbit, and from −90° to 150° C. ($\Delta T=240K$) on the Lunar surface).

A practical approach to harvest the massive thermal cycle energy as a renewable power source is needed as part of the renewable energy technologies that need to be developed.

BRIEF SUMMARY OF THE INVENTION

The systems, methods, and devices of the various embodiments provide pyroelectric sandwich thermal energy harvesters. In the various embodiments of pyroelectric sandwich thermal energy harvesters, generated electrical energy may be stored in a super-capacitor/battery as soon as it is generated. The various embodiments of pyroelectric sandwich thermal energy harvesters may harvest electrical energy from any environment where temperature variations occur. The various embodiments of pyroelectric sandwich thermal energy harvesters may be power sources for space equipment and vehicles in space and/or on earth, as well as the for wireless sensor networks, such as health monitoring systems of oil pipes, aircraft, bridges, and buildings.

These and other features, advantages, and objects of the present invention will be further understood and appreciated by those skilled in the art by reference to the following specification, claims, and appended drawings.

BRIEF DESCRIPTION OF THE SEVERAL VIEWS OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION OF THE INVENTION

Figure 1:
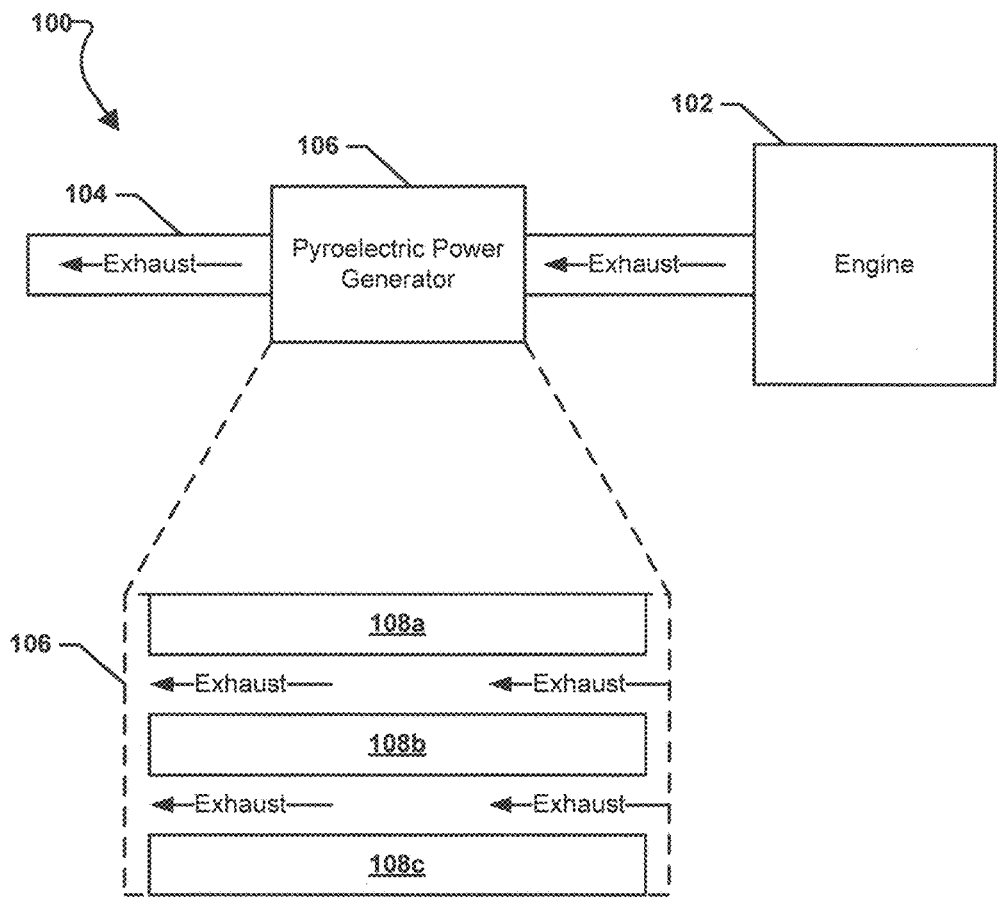
FIG. 1 is a component block diagram illustrating an embodiment pyroelectric power generation system.

For purposes of description herein, it is to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The word "exemplary" is used herein to mean "serving as an example, instance, or illustration." Any implementation described herein as "exemplary" is not necessarily to be construed as preferred or advantageous over other implementations.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

There are limited reports of energy harvesting devices using pyroelectric materials to generate electrical energy from heat, such as those described in U.S. Pat. Nos. 6,528,898, 5,644,184, and 4,647,836. While these patents discuss pyroelectric materials, the following are disadvantages of these patents: 1) U.S. Pat. No. 4,647,836 discloses a pyroelectric energy harvesting device, but the device consists of moving rotors or disks to change temperature by blocking the heat source. The concept is bulky, complex, and has many possible sources of mechanical failure; 2) U.S. Pat. No. 5,644,184 explores the importance of using a metal electrode as the thermal conductor, but does not utilize thermal irradiation modulation such that high energy conversion efficiency was not realized. U.S. Pat. No. 6,528,898 discloses multi-stacked pyroelectric capacitors in series but does not does not utilize the quantum well effect for enhancing energy harvesting because of non-optimal physical dimensions. Rather, in U.S. Pat. No. 6,528,898, hot and cold water lines are used for temperature variation, such that the system is very bulky and complex.

Various embodiments provide pyroelectric sandwich thermal energy harvesters. In the various embodiment pyroelectric sandwich thermal energy harvesters, generated electrical energy may be stored in a super-capacitor/battery as soon as it is generated. The various embodiment pyroelectric sandwich thermal energy harvesters may harvest electrical energy from any environment where temperature variations occur. The various embodiment pyroelectric sandwich thermal energy harvesters may be power sources for space equipment and vehicles in space and/or on earth, as well as the for wireless sensor networks, such as health monitoring systems of oil pipes, aircraft, bridges, and buildings.

The various embodiments include pyroelectric power generator systems for harvesting waste heat, such as waste heat from vehicle engines. The various embodiments provide improvements in devices used to harvest thermal energy from waste heat. The various embodiments leverage pyroelectric materials which generate electricity in response to temperature oscillations. In the various embodiments, pyroelectric elements generate electricity through temperature dependent spontaneous polarization. In the various embodiments, pyroelectric power generators may harvest the heat from waste fluids, including exhaust gas streams from car/jet engines, cooling air streams for electronics, steam fluids (vapor/liquid mixtures) for turbines of power plants, circulating coolants for various mechanics and temperature varying atmospheric air now or tidal flow. For example, various embodiment pyroelectric power generators may harvest the heat of combustion and mechanical driving systems for vehicles even while the vehicles are parked and the engines are not running. In the various embodiments, the generated electrical power can be used to power electrical systems or hybrid motor driving systems to enhance fuel economy in vehicles.

Possible advantages of pyroelectric generators according to the various embodiments for generating electricity, compared to conventional heat engines in conjunction with electrical generators, include potentially lower operating temperatures, less bulky equipment, and fewer moving parts.

The various embodiment pyroelectric devices take advantage of a material's pyroelectric properties to enable energy harvesting. Pyroelectric materials do not require a specific change in temperature ($\Delta T$) and can generate electric power from ambient temperature fluctuations, making the various embodiments a more practical approach to harvest energy from environmental waste heat. While pyroelectric energy harvesters may have broad applications, for the purpose of benchmarking against existing systems, the performance of the pyroelectric harvesters according to the various embodiments are compared to thermoelectric energy harvesters developed for automobiles. Unlike thermoelectric based power generators, the various embodiment pyroelectric power harvesters do not require a bulky cooling system. In addition, pyroelectric power generators according to the various embodiments may harvest heat from combustion and mechanical driving systems even when the engines are not operating while the vehicle is parked.

Pyroelectric power generators of the various embodiments may be made with any pyroelectric material which can survive in the temperature range of the exhaust gas flow selected for use as the thermal energy source. For example, lithium tantalate (referred to as $LiTaO_3$ or LTO) may be used in an embodiment. As other examples, zinc oxide, lithium niobate, lead zirconium titanate (PZT), and/or combinations of one or more of lithium tantalate, zinc oxide, and lithium niobate may be used as the pyroelectric material. Additionally, the pyroelectric material may be any type material including, but not limited to, polycrystalline ceramics, single crystal materials, electroactive polymers, and/or nanocomposites. The pyroelectric properties of LTO were characterized using an oven. 1 cm by 1 cm LTO plates with thicknesses ranging from 0.25 mm to 2 mm. The LTO plates were placed in an oven and temperature was controlled from about 26° C. to 33° C. at a heating/cooling rate of about 2° C./min. The generated voltages tracked the changes in temperature. The 2 mm thick sample exhibited a larger voltage change of about −185V to +166V while the 0.25 mm thick sample showed a voltage change of about −130V to +88V. In contrast to the 2 mm thick sample where voltage generated lagged slightly behind the temperature change, the voltage response from the 0.25 mm thick sample was in phase with the temperature fluctuation. The better response from the thinner sample likely originated from faster heat conductance through the entire volume as compared to the thicker sample.

The energy harvesting devices of the various embodiments may harvest waste heat from combustion systems and increase the fuel economy of vehicles, as an example of retrofitted energy harvester applications. The generated electrical power may be used as an electrical source for electrical systems or hybrid motor driving systems. Potential applications of the various embodiments include, but are not limited to 1) high efficiency power generator for harvesting waste heat from vehicles; 2) thermal energy control of vehicles; and/or 3) enhanced efficiency of conventional solar cells by providing an integrated mechanism to harvest available heat not utilized by the solar cell. Additionally, the various embodiment energy harvesting devices may provide a renewable power source for space facilities, aircraft, and infrastructure and may be suitable for use in other applications on the surface of vehicles (engine, exhaust lines, frame, etc.) and infrastructure and substrate/support structures of solar panels to harvest the heat energy.

As the various embodiment pyroelectric sandwich thermal energy harvesters may easily harvest thermal energy with either a small temperature variation or a large thermal cycle, there may be broad applications for the various embodiments. Examples of applications include, but are not limited to: 1) surfaces of space facilities (If the surface of a space facility is made or covered with the pyroelectric sandwich thermal energy harvester, huge thermal cycle energy in space can be harvested. Simultaneously, the sandwich can serve as structure or a protection layer); 2) surfaces of wing and fuselage of an aircraft to serve as the energy harvester to harvest the huge thermal energy during landing and departure process; 3) side walls of satellites to harvest the thermal cycle energy of satellite walls during rotation processes; 4) a car hood or inlet manifold to harvest the thermal variation at the top of the engine when the car turns on and off, accelerates and brakes, and/or alternates between sun and shade conditions (e.g., day and night parking); 5) thermal cycles from exhaust lines from engines of vehicles during operation; 6) at exhaust line for cars and aircraft to harvest the thermal energy due to temperature variation; 7) on surface of structures such as buildings, bridges, etc., to harvest thermal energy from temperatures variations of the natural environment (day and night thermal cycle, sun and shade, rain/sunshine, etc.); 8) on surface of oil pipes to harvest thermal energy of the temperature variation of the natural environment (day and night thermal cycle, sunshine and shadow, rain/shine, etc.) as renewable power sources for structural monitoring systems; and/or 9) the substrate for solar cells to harvest waste thermal energy from the solar cell and the thermal energy of the temperature variation of the natural environment (day and night thermal cycle, sun and shade, rain/shine, etc.).

The various embodiments may provide a high efficiency pyroelectric power generator. Embodiment high efficiency pyroelectric power generators may harvest waste from the ambient environment. Embodiment high efficiency pyroelectric power generators may harvest waste heat from exhaust gas streams from car engines. Embodiment high efficiency pyroelectric power generators may be designed to harvest waste heat from combustion and mechanical systems of vehicles. Various embodiment methods of utilizing exhaust gas temperature may include inserting the pyroelectric harvester in an exhaust pipe or a tubular chamber. The various embodiments may provide minimal modification of combustion/mechanical system by attaching the embodiment high efficiency pyroelectric power generators at the end of the exhaust pipe. Various embodiments methods may include harvesting thermal energy during driving or while parked. The various embodiments may use thermally stable insulating materials for durable operation. Embodiment high efficiency pyroelectric power generators may harvest waste heat from exhaust gas stream from jet engines. Embodiment high efficiency pyroelectric power generators may harvest waste heat from cooling air stream for electronics. Embodiment high efficiency pyroelectric power generators may harvest waste heat from steam fluids (vapor and/or liquid mixture) for turbines of power plants. Embodiment high efficiency pyroelectric power generators may harvest waste heat from circulating coolants from various machinery. Embodiment high efficiency pyroelectric power generators may harvest waste heat from atmospheric air flow. Embodiment high efficiency pyroelectric power generators may harvest waste heat from submarine water flow or tidal flow. The various embodiments may include storage of the generated electricity in a capacitor through a rectifying circuit. Various embodiment pyroelectric energy harvesters may be fabricated with high Curie temperature materials such as lithium tantalate, zinc oxide, lithium niobate, and etc. The various embodiments may provide enhanced efficiency with increased surface area of pyroelectric elements. Embodiment high efficiency pyroelectric power generators may harvest waste heat from concentrated solar power systems. Embodiment high efficiency pyroelectric power generators may harvest waste heat through integration into photovoltaic solar cells and/or concentrated solar power systems. In an embodiment, a high efficiency hybrid solar cell may be formed by a pyroelectric harvesting device integrated at the bottom of a solar cell.

The various embodiment pyroelectric sandwich thermal energy harvesters may have one or more of the following characteristics: 1) the embodiment pyroelectric sandwich thermal energy harvester may enable converting thermal energy into electrical energy with relatively high efficiency; 2) the embodiment pyroelectric sandwich thermal energy harvester structure may increase energy storage efficiency significantly; 3) the size of the embodiment pyroelectric sandwich thermal energy harvester structure may be easily scalable to accommodate its integration into the environment where there are temperature variations; 4) the embodiment pyroelectric sandwich thermal energy harvester structure may be more durable for applications in various thermal systems; 5) the embodiment pyroelectric sandwich thermal energy harvester may be used broadly in portable electronic devices for military and civilian applications; 6) the embodiment pyroelectric sandwich thermal energy harvester may be used for aircraft, automobiles, and other transportation equipment to harvest thermal energy from environmental temperature variations and waste thermal energy; 7) the embodiment pyroelectric sandwich thermal energy harvester structure may be integrated into surfaces of the wing and fuselage of an aircraft to serve as the energy harvester to harvest potentially significant thermal energy during landing and departure; 8) the embodiment pyroelectric sandwich thermal energy harvester structure can be attached to a car hood, inlet manifold, or the engine muffler to harvest the thermal variation from the engine when the car is turned on and off, accelerates and brakes, moves from sunny to shady conditions (e.g., day and night parking, etc.), and/or the thermal fluctuation during engine cycles; 9) the embodiment pyroelectric sandwich thermal energy harvester structure may be attached to the surface of structures such as buildings, bridges, etc. to harvest thermal energy from temperature variations in the natural environment (day and night thermal cycle, sunny/shady conditions, rain/shine, etc.); 10) the embodiment pyroelectric sandwich thermal energy harvester structure can be attached to the surface of oil pipes to harvest thermal energy from natural temperature variations e.g. day/night, sunny/shady, rain/shine, etc. as renewable power sources for structure monitoring systems; and 11) the embodiment pyroelectric sandwich thermal energy harvester structure can be the substrate for solar cells to harvest waste thermal energy from the solar cell and the thermal energy from natural temperature variations (e.g., day/night, sunny/shady, rain/shine, etc.).

FIG. 1 is a component block diagram illustrating an embodiment pyroelectric power generation system 100. Pyroelectric power generation system 100 may be configured to harvest energy from an automobile combustion system. For example, the pyroelectric power generator 106 may be coupled to the exhaust pipe 104 of the engine 102 of the automobile. The hot exhaust gas may flow through the exhaust pipe 104 front the engine 102. The pyroelectric power generator 106 may be coupled at any point along the exhaust pipe 104, such as inserted in the exhaust pipe 104, attached at the end of the exhaust pipe 104, etc. To take advantage of higher temperatures from the gas stream, the pyroelectric power generator 106 may be inserted in close proximity to the engine 102. The benefit of attaching the pyroelectric power generator 106 at the end of the exhaust pipe may be that it is a retrofit of new technology that does not require gross modification of the combustion/mechanical system. When the engine is operating 102 or while the vehicle is being driven, the hot exhaust gas stream flows through the pyroelectric power generator 106 and the pyroelectric elements 108a, 108b, 108c, may generate electricity through temperature dependent spontaneous polarization. The pyroelectric elements 108a, 108b, 108c may be seen in the expanded cut-away view of the pyroelectric power generator 106 shown in FIG. 1. In various embodiments the pyroelectric elements 108a, 108b, and/or 108c, may be pyroelectric sandwich thermal energy harvesters according to the various embodiments discussed herein. While three pyroelectric elements 108a, 108b, 108c are illustrated in FIG. 1, less or more pyroelectric elements may be included in the pyroelectric power generator 106. For higher efficiency, the surface area in contact with hot exhaust gas may be increased, for example by arranging additional pyroelectric elements in various patterns to create additional channels between, around, and/or over the pyroelectric elements. Additionally, while a single pyroelectric power generator 106 is illustrated in FIG. 1, more than one pyroelectric power generator 106 may be included in the pyroelectric power generation system 100. The generated electricity from the pyroelectric elements 108a, 108b, 108c may be stored in a capacitor through a rectifying circuit. Of note in the design is that the device does not require peripheral systems to induce thermal oscillations. The pyroelectric power generation system 100 (e.g., a pyroelectric harvester system) is thus significantly smaller and more compact than previously disclosed devices.

Figure 2:
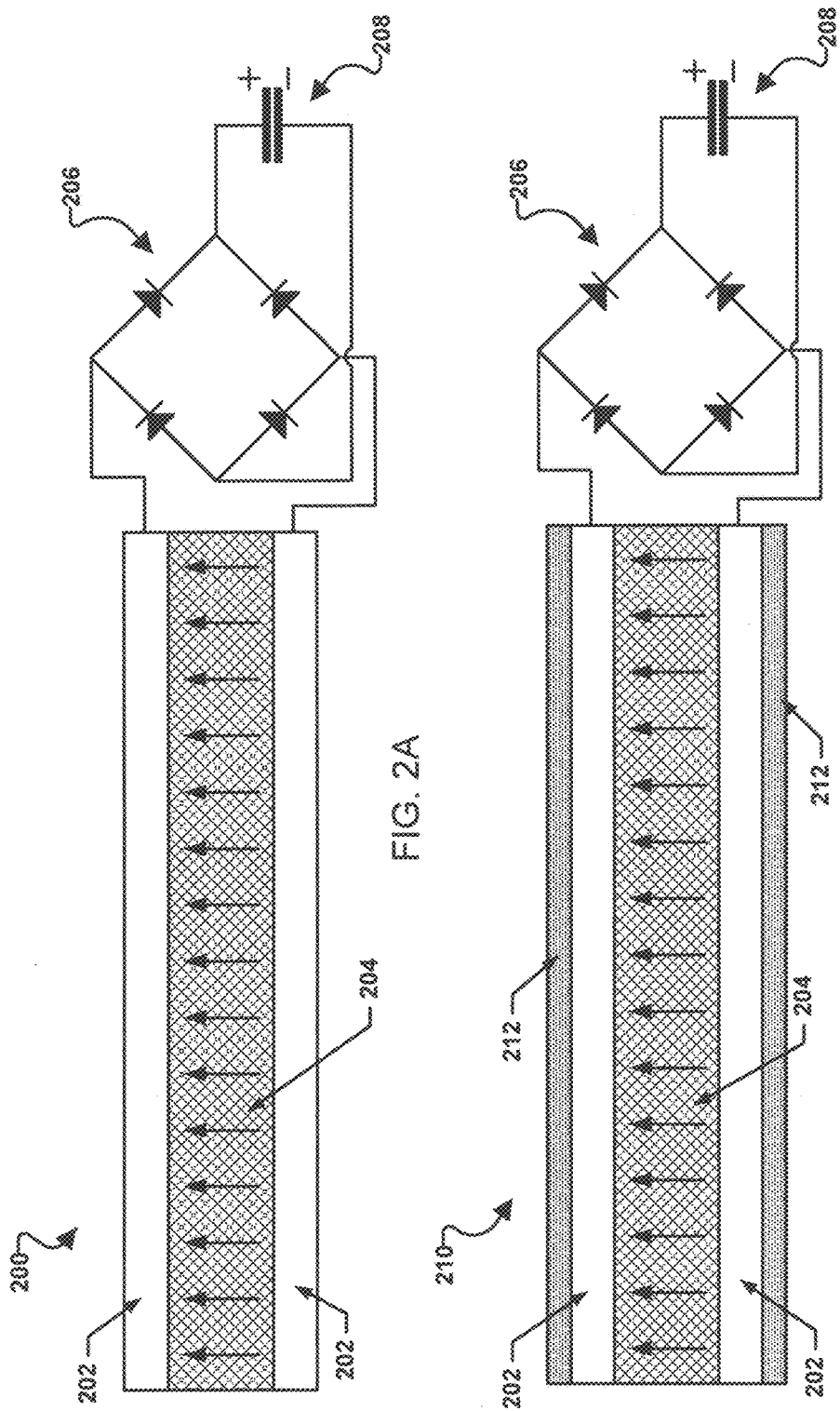
FIG. 2A is a component block diagram of an embodiment pyroelectric sandwich thermal energy harvester.
FIG. 2B is a component block diagram of another embodiment pyroelectric sandwich thermal energy harvester.

FIG. 2A is a component block diagram of an embodiment pyroelectric sandwich thermal energy harvester 200. The pyroelectric sandwich thermal energy harvester 200 may include a pyroelectric thin layer/plate 204 sandwiched with two thin electrode layers 202 on two opposite sides of the pyroelectric thin layer/plate 204. The pyroelectric layer/plate 204 may be poled to align the dipole moment perpendicular to the layer/plate 204 as illustrated by the arrows shown in FIG. 2A overlaid on the layer/plate 204 representing the dipole moment direction. The pyroelectric layer/plate 204 may be any kind of pyroelectric material, including, but not limited to polycrystalline ceramics, single crystal materials, electroactive polymers, and/or nanocomposites. The electrode layers 202 may be any kind of conductive material which can be attached to the surface of the selected pyroelectric material for the pyroelectric layer/plate 204 with good adhesion. The pyroelectric sandwich thermal energy harvester 200 may be connected to an energy harvesting and storage circuit, such as an energy harvesting and storage circuit including a rectifier 206 and a storage device 208, such as a super-capacitor or battery. The energy harvesting and storage circuit may enable storage of the electrical charge as it is generated by the pyroelectric sandwich thermal energy harvester 200. More advanced energy harvesting and storage circuits than that illustrated in FIG. 2A may be connected to the pyroelectric sandwich thermal energy harvester 200 to increase energy storage efficiency.

FIG. 2B illustrates another embodiment pyroelectric sandwich thermal energy harvester 210, similar to pyroelectric sandwich thermal energy harvester 200 illustrated in FIG. 2A. A difference between the pyroelectric sandwich thermal energy harvester 200 and the pyroelectric sandwich thermal energy harvester 210, is that pyroelectric sandwich thermal energy harvester 210 may include two protective layers 212 on the outer layers of the electrode layers 202. Thus, the pyroelectric thin layer/plate 204 may be sandwiched between the two thin electrode layers 202 and the pyroelectric thin layer/plate 204 and two thin electrode layers 202 may be sandwiched between the two protective layers 212. The protective layers 212 may be any thermally conductive material, which can transfer thermal energy efficiently, as well as protect the pyroelectric material 204 for the harvester during use. The thermal expansion coefficient of the protective layers 212 may be equal to or larger than the thermal expansion coefficient of the pyroelectric material 204 to avoid energy cancellation of the piezoelectric charge of the pyroelectric material 204 from the mechanical stress energy due to thermal expansion mismatch between the pyroelectric material 204 and the protective layers 212. Where the application is dependent on relatively small temperature variations (such as $\Delta T<100°$ C.) a thermal expansion coefficient for the protective layers 212 larger than the thermal expansion coefficient of the pyroelectric material 204 may be selected, so that additional piezoelectric charges generated due to the mechanical stress energy resulting from the thermal expansion mismatch may enhance the harvested energy. For applications where there are large thermal cycles ($\Delta T > 100°$ C.), the thermal expansion coefficients of the protective layers 212 and the pyroelectric material 204 may be as close as possible to avoid device damage from the larger thermal expansion mismatch.

In operation of the pyroelectric sandwich thermal energy harvesters 200 and/or 210, when the pyroelectric element 204 is subjected to temperature changes, the surface charge density generated by the pyroelectric element 204 is proportional to the change in temperature. The electrical charge produced from the pyroelectric plate/layer 204 is described as:

$$\Delta Q = (Q - Q_0) = pA(T - T_0) = pA\Delta T$$

where T is the final temperature, and $T_0$ is the initial temperature, Q is the final accumulated electrical charge at temperature T, $Q_0$ is the initial accumulated electrical charge at the initial temperature $T_0$, p is the pyroelectric coefficient, and A is the area of the pyroelectric plate/layer 204, respectively. $Q_0$ depends on the initial condition. For example, if $T_0$ remains constant for an extended period of time, $Q_0$ could be very small because the generated pyroelectric charges easily dissipate due to dielectric leakage and other effects.

Since pyroelectric materials are a type of dielectric material, the pyroelectric material structure itself is a capacitor. The capacitance of pyroelectric sandwich thermal energy harvesters 200 and/or 210 is:

$$C_p = \varepsilon_r \varepsilon_0 \frac{A}{t}$$

where, $\varepsilon_0$ is the vacuum permittivity, $\varepsilon_r$ is the relative permittivity (also called dielectric constant), which is a temperature dependent value for most materials, and t is the thickness of the pyroelectric layer/plate 204, respectively. If the pyroelectric sandwich thermal energy harvesters 200 and/or 210 are not connected with the rectifier 206 and the storage device 208, the voltage crossing from one outer pyroelectric surface of the pyroelectric layer/plate 204 to the other outer pyroelectric surface of the pyroelectric layer/plate 204 is:

$$V = \frac{Q}{C_p}$$

or $$\Delta V = \frac{\Delta Q}{C_p} = \frac{pt\Delta T}{\varepsilon_r \varepsilon_0}.$$

The generated electric energy stored in the pyroelectric sandwich thermal energy harvesters 200 and/or 210 is:

$$dV = \frac{ps}{\varepsilon_0 \varepsilon_r} dT(t).$$

The generated energy from $T_0$ to T is $$\Delta E = \frac{V^2 - V_0^2}{2} C_p = \frac{Q^2 - Q_0^2}{2C_p} = \frac{(pA\Delta T + 2Q_0)pA\Delta Tt}{2\varepsilon_0 \varepsilon_r}$$

When $Q_0 = 0$, $$\Delta E = \frac{p^2 \Delta T^2 At}{2\varepsilon_0 \varepsilon_r}$$

When the pyroelectric sandwich thermal energy harvesters 200 and/or 210 are connected with the rectifier 206 and the storage device 208 some of the generated electric charge will be immediately transported into the storage device 208. In the charge transportation processing, only the electronics with absolute energy larger than a threshold energy $eV_{th}$ (i.e., $eV \geq eV_{th}$ or $eV \leq -eV_{th}$) can pass through the rectifier 206 and be stored in the storage device 208, such as a super-capacitor. Not all the generated electrical charges in the pyroelectric sandwich thermal energy harvesters 200 and/or 210 can be transported into the storage device 208, such as a super-capacitor. Here, the threshold voltage $V_{th}$ is:

$$V_{th} = 2V_{FW} + V_{CS}$$

where, $V_{FW}$ is the forward voltage of the diode in the rectifier 206, and $V_{CS}$ is the level of the voltage in the storage device 208, such as a super-capacitor/battery. The energy carried by the same electronics is different from the pyroelectric sandwich thermal energy harvesters 200 and/or 210 to the storage device 208, such as a super-capacitor/battery. The electrical energy carried by electronics in the pyroelectric sandwich thermal energy harvesters 200 and/or 210 is $eV_p$ and $eV_{CS}$ for the storage device 208. In the charge transportation process, the electrical energy will be only partially transferred into the storage device 208, such as a super-capacitor. The energy lost becomes heat and other types of energy during the charging process.

Figure 3:
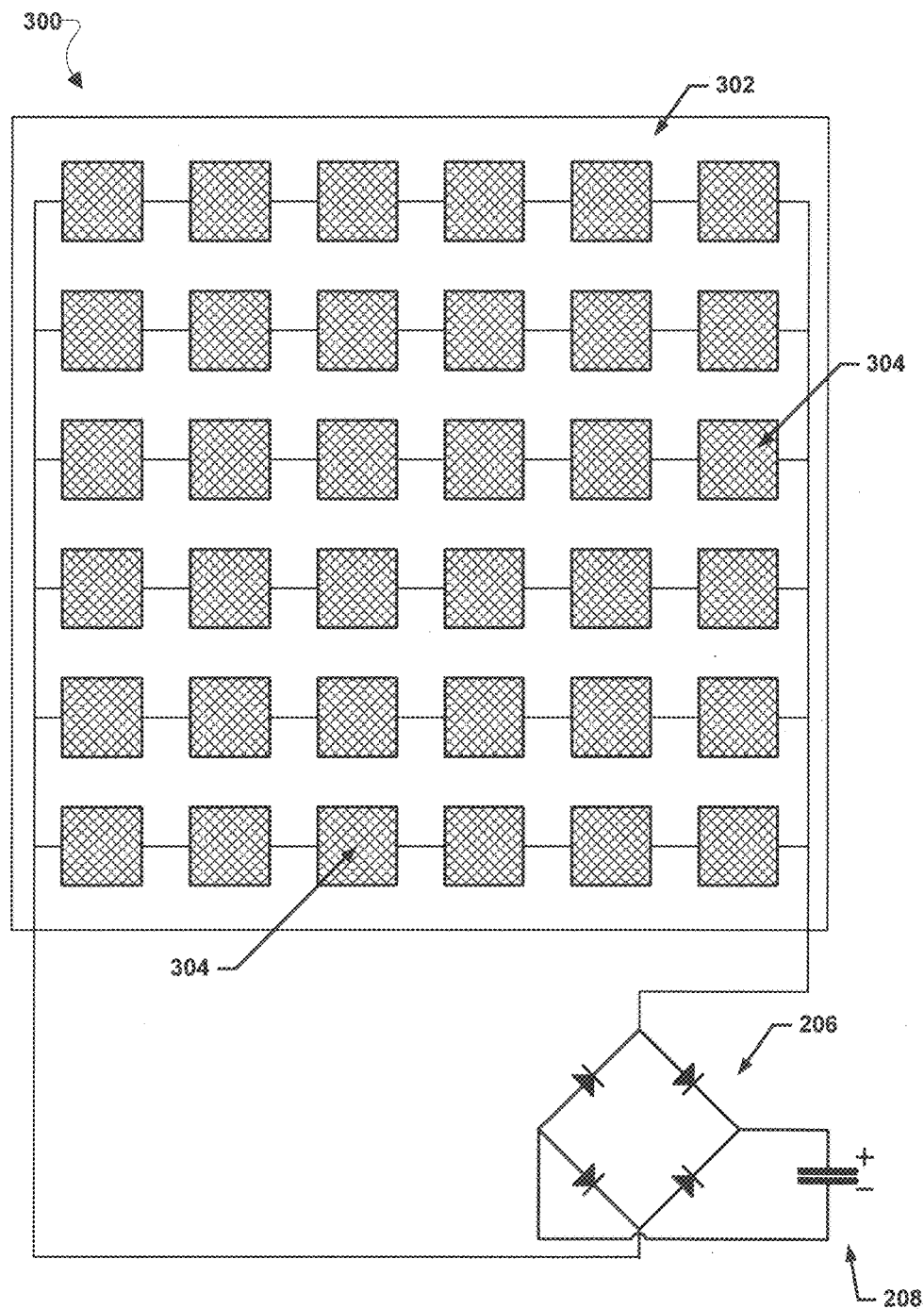
FIG. 3 illustrates an embodiment pyroelectric power generator including multiple pyroelectric sandwich thermal energy harvesters connected together.

FIG. 3 illustrates an embodiment pyroelectric power generator 300 including multiple pyroelectric sandwich thermal energy harvesters 304 connected together and disposed in a substrate 302, for example embedded on the substrate 302. The multiple pyroelectric sandwich thermal energy harvesters 304 connected together may be connected to an energy harvesting and storage circuit, such as the energy harvesting and storage circuit including the rectifier 206 and the storage device 208. The multiple pyroelectric sandwich thermal energy harvesters 304 may be connected together in parallel and/or series. For a specific harvesting system, the connection configuration may be selected based on the rate of temperature change and the size of the multiple pyroelectric sandwich thermal energy harvesters 304. The goal in selecting the connection structure may be to maximize the current flow through the rectifier 206 for energy storage, and minimize the voltage difference between the $V_P$ and $V_{CS}$. The configuration of multiple pyroelectric sandwich thermal energy harvesters 304 connected together and disposed in a substrate 302 may increase energy storage efficiency and reduce the cost of the pyroelectric power generator 300.

Embodiment pyroelectric sandwich thermal energy harvesters were fabricated and tested as part of an experimental validation process. A pyroelectric element was integrated with 5 pieces of 18 mm×18 mm×1 mm lead zirconium titanate (PZT) (APC international 850 PZT) pyroelectric thin plate with silver paint electrodes. The 5 pieces of pyroelectric PZT plate were set in one line in parallel and sandwiched with two pieces of 90 mm×18 mm×0.025 mm brass shims which served as additional electrodes and electrical connection layers. Then, the structure was further sandwiched on the outside with two 0.05 mm brass plates for the protection layer. Hysol RE2039/HD3501 epoxy was used as the adhesive to bind the sandwich structure, thereby forming a single pyroelectric sandwich thermal energy harvester. The environment, temperature, and generated voltage from the single pyroelectric sandwich thermal energy harvester versus time was monitored. The amplitude of the generated voltage ranged from −185V to +155 V when the environmental temperature changed from 25.3° C. to 34.9° C. The rate of the generated voltage for single pyroelectric sandwich thermal energy harvester was 35.4 V/° C. (V/K). The dimension of the single pyroelectric sandwich thermal energy harvester was 90 mm×18 mm×1 mm. The capacitance of the single pyroelectric sandwich thermal energy harvester was 13.5 nF. 0.15 J/m$^2$ energy can be generated for a 1 mm thick pyroelectric PZT element with variation of 5° C.

Four of the pyroelectric sandwich thermal energy harvesters fabricated from the PZT, brass, and epoxy as described above were connected in parallel to a 1000 µF super-capacitor. The four pyroelectric sandwich thermal energy harvester pyroelectric power generator measured 90 mm×72 mm×1 mm. The voltage level of the charged 1000 µF super-capacitor ranged from 0.0 V to 0.074 V when it was charged by the harvester for the environmental temperature fluctuating from 25.3° C. to 34.9° C. in 4.25 cycles. The stored electrical charge was 75 µC and the energy was 2.55 µJ. This indicates that the harvester can harvest energy with a small temperature variation. The stored energy was only $\frac{1}{1000}$ of the generated energy. This is because the generated voltage was much higher than the level of voltage in the super-capacitor. When $V_p \gg V_{cs}$, the energy of an electron in the pyroelectric structure was $eV_p$. It was reduced to $eV_{cs}$ after it was transferred into the super-capacitor. The energy of $eV_p^- eV_{cs}$ for one electron was converted to other types of energy during the charge transportation processing. Therefore, the various embodiments may be applied to increase energy storage efficiency in practical applications. Since the generated voltage rate was 35.4 V/° C. (V/K), a majority of the generated electrical charges can pass through the rectifier.

If the pyroelectric element is enlarged to 1 m×1 m×1 mm, the voltage level of the super-capacitor, the stored electrical charge can theoretically increase by about 155 times so the stored electrical energy will increase about 24025 (155$^2$) times. The level of the voltage in the charged super-capacitor will be from 0 to 11.6 V for the small temperature variation from 25.3° C. to 34.9° C. in 4.25 cycles. The stored electrical charge will be 11,619 µC and the energy will be 60,560 µJ.

A large range of thermal cycles is available in space environments, e.g. temperature ranges from −59° C. to 93° C. (ΔT=152K) per thermal cycle on Low Earth Orbit, and from −90° C. to 150° C. (ΔT=240K) on the Lunar surface. There is also a large temperature differential between ground and cruise altitudes for airplanes. In order to verify the performance of the sandwich pyroelectric harvesters for those applications, experiments were conducted where the environmental temperature was varied from −150° C. to +150° C. The voltage level of the charged 1000 µF super-capacitor was raised from 0.0 V to 0.43 V when it was charged by the harvester as the environmental temperature changed from room temperature down to −150° C. and then increased to +150° C. The stored electrical charge was 430 µC and the energy was 92.6 µJ. If the pyroelectric elements were enlarged to 1 m×1 m×1 mm, the voltage of the super-capacitor will be charged from 0 to 41.5 V, when the environmental temperature changes from −150° C. to +150° C. The charging rate will be 0.138 V/° C. m$^2$) for charging a 1000 µF super-capacitor with a 1 mm thick pyroelectric harvester. The stored electrical charge will be 66,600 µC, and the energy will be 2.2 J.

Figure 4:
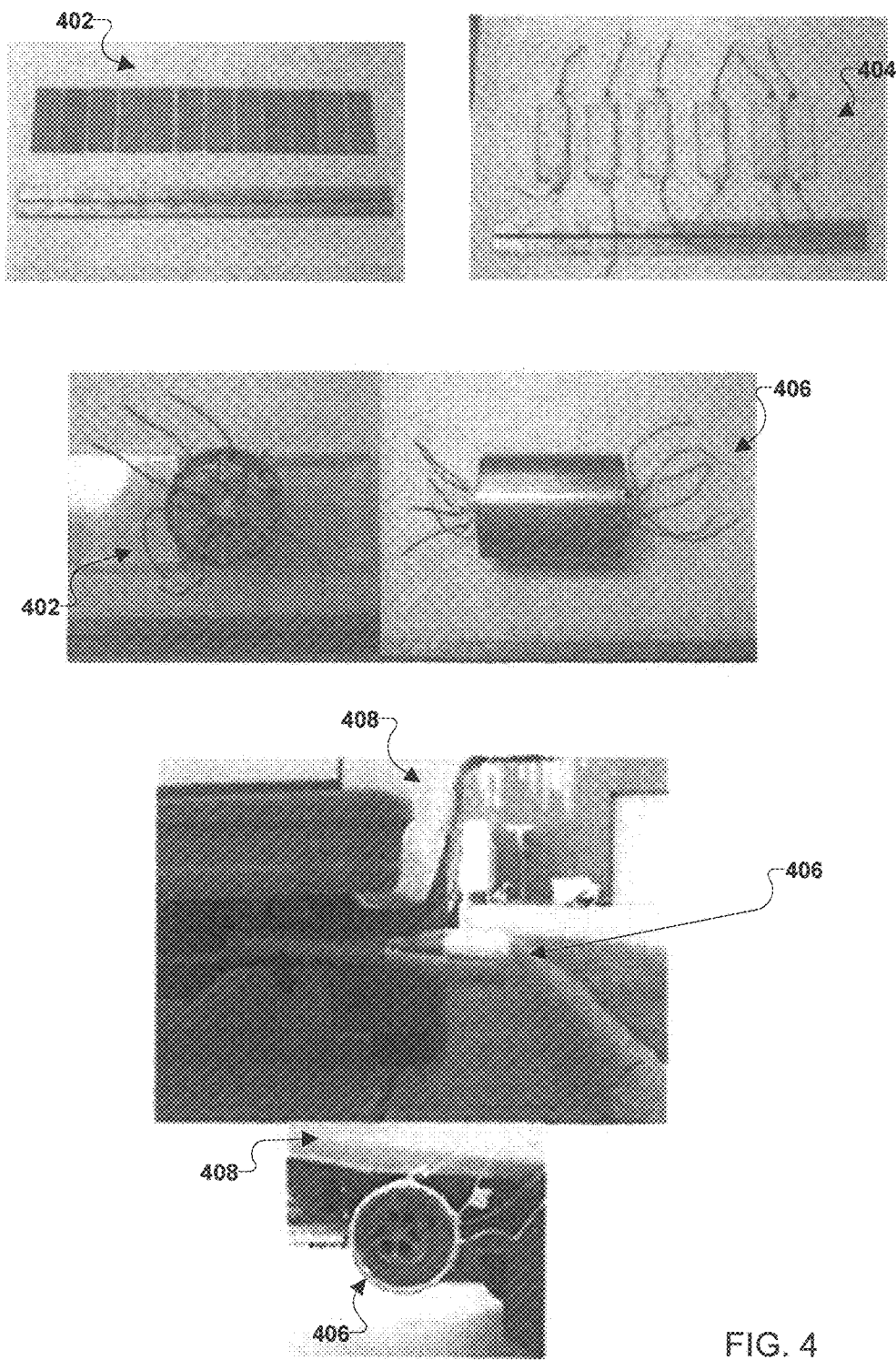
FIG. 4 shows pictures of the fabrication process of an embodiment pyroelectric energy harvester.
Figure 5:
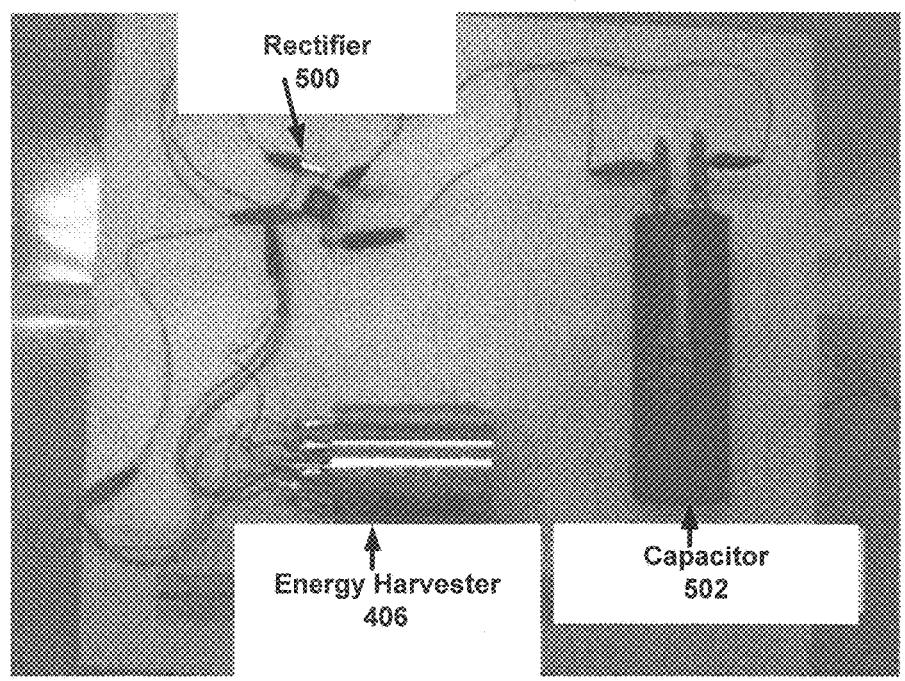
FIG. 5 shows pictures of an actual device set-up for energy storage according to an embodiment.

FIG. 4 shows pictures of the fabrication process of an embodiment pyroelectric energy harvester 406 used for experimental research. Lithium tantalate (LTO) was chosen for this embodiment. The LTO plate (0.5 mm thick) was sliced into rectangular pieces, deposited with silver metal as electrodes, and attached with wires to form the pyroelectric energy harvester 406. 12 pieces of LTO 402 were attached to wires, insulated, and assembled into pairs of pieces 404. These pairs 404 were assembled in the shape of six blades in a circular column to form the pyroelectric energy harvester 406. The assembled pyroelectric energy harvester 406 was installed inside a muffler for attachment to the end of an exhaust pipe of a test vehicle 408. Because the generated voltages are in the form of positive or negative pulses, the generated electrical energy needs to be rectified for storage in a capacitor or a battery. FIG. 5 shows an actual device set-up for energy storage according to an embodiment in which the pyroelectric energy harvester 406 is connected to the rectifier 500 connected to the capacitor 502. The pyroelectric energy harvester 406 was installed at the end of an exhaust pipe of the truck (a Ford Ranger XL truck) and the generated electrical voltage was measured while driving at NASA Langley Research Center at the average speed of about 18 mph for about 5 minutes. The maximum voltage recorded was about 6182.0V, which is equivalent to an electrical energy of about 24.8 mJ. The calculated energy densities were about 3.1 J/cm$^3$ and 383.4 J/kg at the maximum. The average electrical power was 6.7 mW. The power densities were 827 mW/cm$^3$ and 110 W/kg.

To measure stored energy, a 2200 µF capacitor 502 and a rectifier 500 were connected as shown in FIG. 5. While driving on the road for about 11 minutes and at a relatively low speed (limit about 25 mph), the temperature of the gas exhaust stream reached over 180° C. with a variation of over 40° C. The stored voltage level in a capacitor 502 was about 0.9V. After parking and turning off the engine, the pyroelectric energy harvester 406 continued to store the energy by harvesting the heat from the combustion/mechanical systems of the automobile. The performance of the pyroelectric energy harvester 406 was also tested by revving the engine. The temperatures of the exhaust gas and in the area close to the pyroelectric energy harvester 406 increased by up to 359.6° C., and exhibited large variations when the acceleration pedal was repeatedly pushed and released. The stored voltage and electrical energy were about 1.0V and 1.1 mJ after a 5 minute test.

To determine the effect of typical driving speeds on the performance of the pyroelectric energy harvester, the harvester was tested on a vehicle (a Mini Cooper) driven on the racetrack of Langley speedway (Hampton, Va.; 0.398 miles in length, 6° of banking in the corners, 4° of banking in the corners). Vehicle speed was controlled from zero to about 57 mph, and the temperature of the gas exhaust stream reached over 450° C. with a variation of over 130° C. The maximum stored voltage rate in a capacitor 502 at high gas temperature over 180° C. was about 0.3 V/min, as calculated from the slope of stored voltage line. This value was about four times higher than that obtained from a vehicle driven at about half the speed.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." As used herein, the term "and/or" includes any and all combinations of one or more of the associated listed items. As also used herein, the term "combinations thereof" includes combinations having at least one of the associated listed items, wherein the combination can further include additional, like non-listed items. Further, the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

Reference throughout the specification to "another embodiment", "an embodiment", "exemplary embodiments", and so forth, means that a particular element (e.g., feature, structure, and/or characteristic) described in connection with the embodiment is included in at least one embodiment described herein, and can or cannot be present in other embodiments. In addition, it is to be understood that the described elements can be combined in any suitable manner in the various embodiments and are not limited to the specific combination in which they are discussed.

What is claimed is:

1. A pyroelectric sandwich thermal energy harvester, comprising:
   first and second protective layers constructed of a thermally conductive material;
   first and second electrode layers positioned adjacent to the first and second protective layers, respectively, such that the first and second electrode layers are sandwiched between the first and second protective layers; and
   a pyroelectric layer sandwiched between the first and second electrode layers, the pyroelectric layer being poled to align a dipole moment perpendicular to the pyroelectric layer, wherein a thermal expansion coefficient of the first and second protective layers is larger than a thermal expansion coefficient of the pyroelectric layer.

2. The energy harvester of claim 1, wherein the pyroelectric layer includes one or more of lithium tantalate, zinc oxide, lithium niobate, and lead zirconium titanate.

3. The energy harvester of claim 1, wherein the pyroelectric layer is one of a polycrystalline ceramic, a single crystal material, an electroactive polymers, and a nanocomposite.

4. A pyroelectric power generator, comprising:
a substrate; and
at least one pyroelectric sandwich thermal energy harvester imbedded in the substrate, the pyroelectric sandwich thermal energy harvester comprising:
   first and second protective layers constructed of a thermally conductive material;
   first and second electrode layers positioned adjacent to the first and second protective layers, respectively such that the first and second electrode layers are sandwiched between the first and second protective layers; and
   a pyroelectric layer sandwiched between the two electrode layers, the pyroelectric layer being poled to align a dipole moment perpendicular to the pyroelectric layer, wherein a thermal expansion coefficient of the first and second protective layers is larger than a thermal expansion coefficient of the pyroelectric layer.

5. The pyroelectric power generator of claim 4, further comprising an energy harvesting and storage circuit connected to the at least one pyroelectric sandwich thermal energy harvester.

6. The pyroelectric power generator of claim 5, wherein the energy harvesting and storage circuit comprises at least one rectifier and at least one storage device.

7. The pyroelectric power generator of claim 6, wherein the at least one storage device includes a capacitor or a battery.

8. The pyroelectric power generator of claim 4, wherein the pyroelectric sandwich thermal energy harvester comprises two or more of the pyroelectric sandwich thermal energy harvesters connected together.

9. The pyroelectric power generator of claim 8, wherein the two or more pyroelectric sandwich thermal energy harvesters are connected in parallel.

10. The pyroelectric power generator of claim 8, wherein the two or more pyroelectric sandwich thermal energy harvesters are connected in series.

11. A method, comprising:
providing a pyroelectric power generator, comprising:
   at least one pyroelectric sandwich thermal energy harvester, the pyroelectric sandwich thermal energy harvester comprising:
      first and second protective layers constructed of a thermally conductive material;
      first and second electrode layers adjacent to the first and second protective layers, respectively such that the first and second electrode layers are sandwiched between the first and second protective layers; and
      a pyroelectric layer sandwiched between the first and second electrode layers, the pyroelectric layer being poled to align a dipole moment perpendicular to the pyroelectric layer, wherein a thermal expansion coefficient of the first and second protective layers is larger than a thermal expansion coefficient of the pyroelectric layer; and
   an energy harvesting and storage circuit connected to the at least one pyroelectric sandwich thermal energy harvester; and
coupling the pyroelectric power generator to a portion of a structure such that the pyroelectric power generator generates electric charge energy.

12. The method of claim 11, wherein the structure is one or more of a space facility, an aircraft, a satellite, a vehicle, a building, a bridge, a pipe, a portable electronic device, and a solar cell.

13. The method of claim 11, wherein the structure is a vehicle and the portion of the structure is an exhaust line.

* * * * *